United States Patent
Cheung et al.

(10) Patent No.: US 7,060,970 B2
(45) Date of Patent: Jun. 13, 2006

(54) TEMPERATURE COMPENSATING DEVICE FOR APD OPTICAL RECEIVER

(75) Inventors: Hee-Won Cheung, Suwon-shi (KR); Seong-Taek Hwang, Pyongtaek-shi (KR); Han-Lim Lee, Seoul (KR); Byung-Chang Kang, Yongin-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 273 days.

(21) Appl. No.: 10/688,496

(22) Filed: Oct. 17, 2003

(65) Prior Publication Data

US 2004/0129863 A1    Jul. 8, 2004

(30) Foreign Application Priority Data

Jan. 2, 2003    (KR) .................... 10-2003-0000143

(51) Int. Cl.
*H01J 40/14*    (2006.01)
*H01J 7/24*    (2006.01)

(52) U.S. Cl. ............... 250/238; 250/214 F; 250/214 C; 327/514

(58) Field of Classification Search ............ 250/214 R, 250/214 C, 238; 327/514
See application file for complete search history.

(56) References Cited

U.S. PATENT DOCUMENTS 6,157,022 A * 12/2000 Maeda et al. ........... 250/214 R

* cited by examiner

*Primary Examiner*—Stephone B. Allen
*Assistant Examiner*—Patrick J. Lee
(74) *Attorney, Agent, or Firm*—Ota & Reiter, L.L.C.

(57) ABSTRACT

Disclosed is a temperature-compensating device for an APD optical-receiver system using an APD (Avalanche Photo Diode). The device includes a temperature-compensating circuit which employs a digital potentiometer capable of linear compensation through data look-up in compensating the decrease in gain caused by the temperature change of the APD.

8 Claims, 7 Drawing Sheets

TEMPERATURE COMPENSATING DEVICE FOR APD OPTICAL RECEIVER

CLAIM OF PRIORITY

This application claims priority to an application entitled "Temperature Compensating Device for avalanche photo diode (APD) Optical Receiver," filed with the Korean Intellectual Property Office on Jan. 2, 2003 and assigned Ser. No. 2003-143, the contents of which are hereby incorporated by reference.

BACKGROUND OF THE INVENTION

1. Field of the Invention

The present invention relates to an optical-receiver system and, in particular, to a temperature-compensating device for compensating a performance loss associated with a temperature in an optical receiving device, which employs an avalanche photo diode (APD).

2. Description of the Related Art

When light is incident into an optical diode and a reverse-bias voltage is applied gradually thereto in an increasing fashion, electrons are produced and accelerated in a high electric field, causing atoms to collide with each other. As a result, an avalanche phenomenon occurs in which new electrons and holes are produced. An avalanche photo diode (APD) is used for converting an optical signal into an electrical signal and as a light-receiving element in an optical communication system. Further, the APD has a characteristic suitable for use in a high-speed digital line.

Moreover, the APD has its own gain control and is capable of detecting a very low level of light. Therefore, the APD is preferred by developers who seek optimum sensitivity in a fiber-optic receiver.

However, in order to obtain a sufficient level of such an internal gain, it is necessary for the APD to be supplied with a high bias (30 to 40V). Yet, the APD has temperature-sensitive gain characteristics. Therefore, in an optical-receiving system that employs an APD not only for obtaining a constant gain of the APD but also for supplying a high voltage, a compensation circuit is necessary for compensating the change in temperature. In addition, the APD has some drawbacks in that due to an electric-current amplification effect caused by the avalanche phenomenon, its signal-to-noise (S/N) ratio and bias voltage tend to be high and highly temperature dependent.

Currently, a control circuit that incorporates an APD uses a power switching technique known as PWM (Pulse Width Modulation), which serves to amplify the voltage at a high level with a minimum current from a power generator.

For example, "MAXIM1771" chips manufactured by Maxim Integrated Products Inc., of 120 San Gabriel Dr., Sunnyvale, Calif., USA, are commonly used as a core chip for amplifying the voltage. The voltage level of this chip is changed in accordance with a change in the temperature. The change of the voltage level in accordance with the change in the temperature is controlled by the voltage level applied to the feedback terminals of the chip. As such, the range of voltage change can be controlled and determined by the feedback terminals. Here, a temperature-compensating circuit is formed by combining a resistance used for controlling the slope indicative of the voltage change and a resistance connected to a thermistor incorporated in the APD used to provide a linear behavior of resistance in accordance with the temperature.

FIG. 1 shows a configuration of a conventional APD optical-receiver system. As shown, the conventional APD optical-receiver system comprises: a voltage-generator section 11 for generating and outputting a high reverse bias using a low-voltage input; an APD-receiving section 13 provided with an APD 131 and a thermistor 132 for sensing the temperature change in the APD; and, a temperature-compensating section 12 for compensating a decrease in gain caused by the temperature change in the APD 131, so that the voltage generator 11 can generate a linearized output voltage.

FIG. 2 shows the configuration of the conventional APD optical-receiver system shown in FIG. 1 in more detail.

Referring to FIG. 2, the voltage-generator section 11 comprises a "MAXIM 1771" chip mentioned earlier and uses a PWM power switching technique; a voltage-generator section 11 generates a reverse bias in the range of 30V to 40V responsive to the input voltage of 5V to 8V. In operation, the APD 131 connected to the output Vo of the voltage-generator section 11 suffers from a decrease of 0.2%/° C. in the gain factor as the temperature increases. Therefore, in order to maintain the receiving sensitivity at a constant level, it is necessary to increase the reverse bias at the same rate as the rate of temperature increase.

In order to increase a reverse bias in accordance with the temperature, the resistances of the temperature-compensating section 12 are connected to the thermistor 132 of the APD in parallel, so that it is possible to tune the change rate of the resistance in accordance with the temperature change to generate an output voltage Vo at a constant level. This can be achieved by combining the selected resistances R2, R3, and R4 of the temperature—compensating section 12 and the resistance RT of the thermistor 132 of the circuit, as a result of which it is possible to control the range of the output voltage Vo of the voltage-generator section 11 in the circuit according to following Equation 1, which defines the relationship between the reference voltage Vref and the output voltage Vo.

$$V_o = V_{ref} \frac{R1}{R2 + R3 + \left(\frac{R4s\,RT}{R4 + RT}\right)} \quad \text{Equation 1}$$

That is, in the above example, a voltage generation is provided in accordance with power switching by the voltage generator 11, which incorporates the "Maxim1771" chip, and because the voltage generation consists of a voltage amplification in accordance with the ratio defined by Equation 1, the related resistances R2 and R3 control the slope gain of the voltage amplification and the temperature linearization of the APD in accordance with the change of temperature, respectively. Here, the change and the amplification of the voltage determined by R1 and R2 are shown in FIGS. 3a and 3b.

FIG. 3a shows the relationship between the parallel resistance value RT and the temperature. In particular, the X-axis indicates the temperature of the APD 131 and the Y-axis indicates the resistance value of the thermistor 132. FIG. 3b shows the relationship between the output voltage Vo and the temperature. In particular, the X-axis indicates the temperature of the APD 131 and the Y-axis indicates the output voltage Vo of the entire circuit.

Referring to the operation of the conventional APD optical-receiver system in more detail, it is necessary to consider the entire slope of the voltage amplification and the voltage magnitude of the resistance R2 in the temperature compensator 12. It is also necessary to tune the linearity of the resistance change in accordance with the temperature change by changing the resistance R3 of the temperature compensator 12, which is connected to the thermistor 132 in parallel.

However, each APD 131 has a different reverse-bias value needed for obtaining an inherent gain factor, and the change of voltage is sensitive to the change of resistance values of R2 and R3 of the temperature compensator 12. Therefore, it is necessary to establish the resistances R2 and R3 of the temperature compensator 12 whenever the APD 121 is replaced in a circuit board and whenever the ambient temperature is changed, in order to maintain a constant receiving sensitivity, i.e., in order to allow the output voltage to be linearized. If the resistance R2 is made as a variable one in order to maintain the receiving sensitivity constant as shown in FIG. 2, it may be possible to meet under the macroscopic condition of 0.2%/° C. at the initial and the final ends of the entire temperature-changing region. However, it is impossible to obtain a voltage-change rate of 0.2%/° C. for the entire temperature spans. Also, it is necessary to debug each resistance value of the R2 and R3 even if such a voltage-change rate can be obtained. Furthermore, it is difficult to linearize the resistance value as Equation 1, which is needed for making the resistance value by an analogue method to be expressed as a fractional equation.

SUMMARY OF THE INVENTION

Accordingly, the present invention has been made to solve the above-mentioned problems occurring in the prior art and provides additional advantages, by providing a temperature-compensating circuit for use an APD optical-receiver system that is capable of performing a linear compensation according to predetermined criteria in compensating a decrease in the gain caused by temperature change in an APD (Avalanche Photo Diode).

In one embodiment, there is provided a temperature-compensating device for an APD optical receiver which includes a voltage-generator section, and an APD optical-receiving section provided with an APD, and a thermistor for sensing the temperature change of the APD. The temperature-compensating device further comprises: a control means connected to the thermistor and arranged to perform a control in such a manner that the control means receives a first resistance value from the thermistor, determines temperature data of the APD using the first resistance value, determines the output-voltage data corresponding to the resistance value, and outputs a second resistance-value data for generating an output voltage corresponding to the output-voltage data; and, a resistance means that outputs a second resistance value to the input terminal of the voltage-generator section in accordance with the second resistance-value data outputted from the control means.

BRIEF DESCRIPTION OF THE DRAWINGS

The above features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be described with reference to the accompanying drawings. For the purposes of clarity and simplicity, a detailed description of known functions and configurations incorporated herein will be omitted as it may make the subject matter of the present invention unclear.

Figure 1:
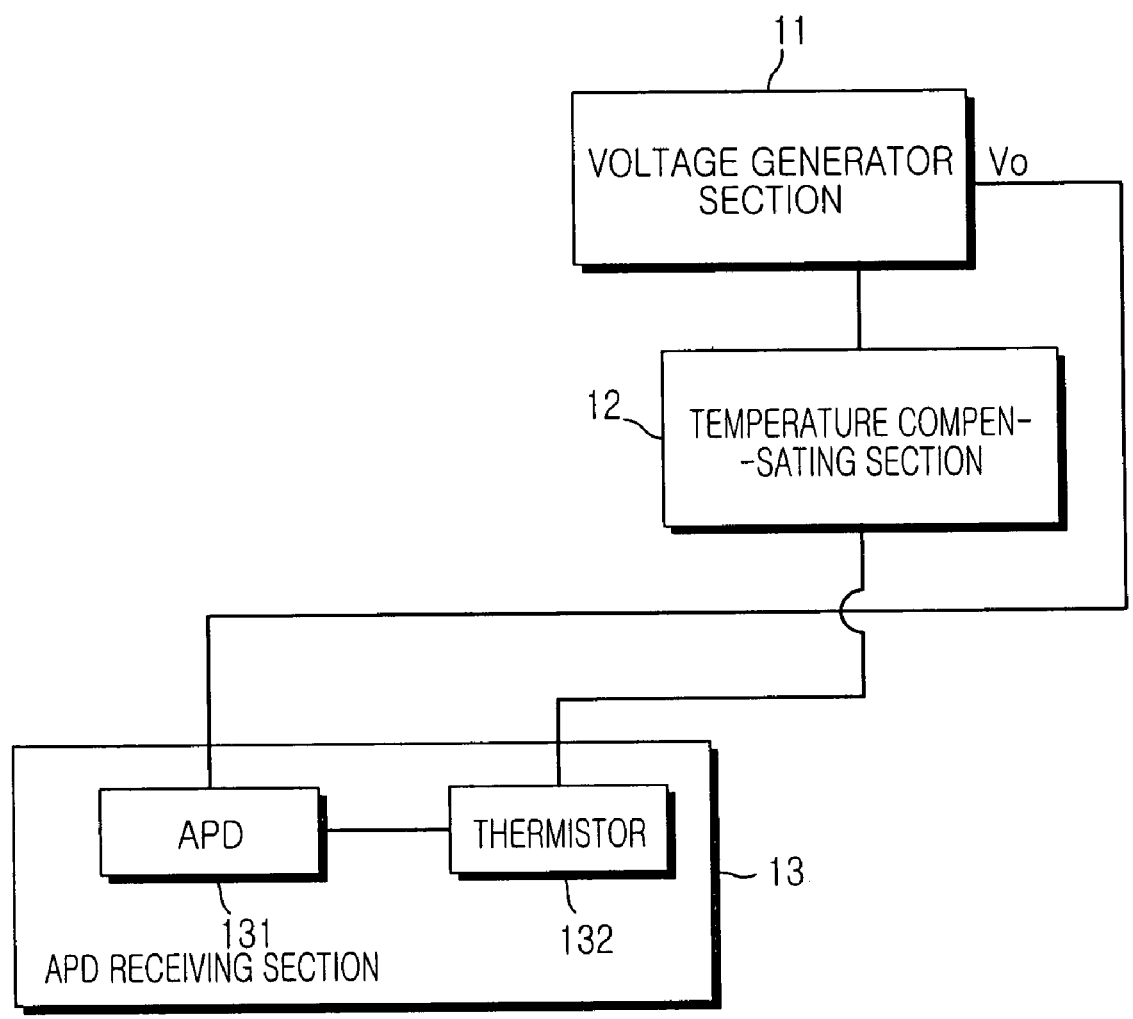
FIG. 1 shows a configuration of a conventional APD optical-receiver system.
Figure 2:
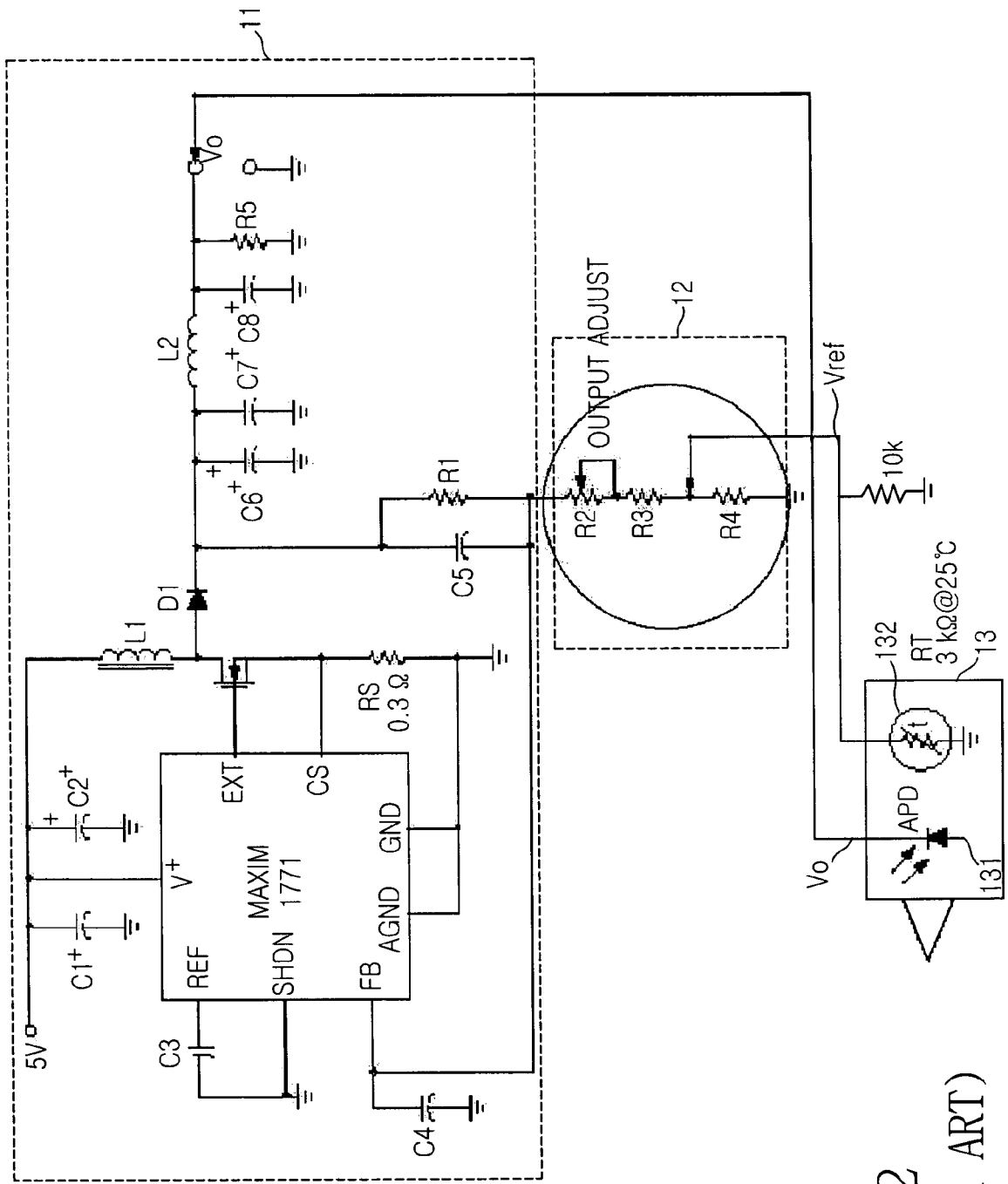
FIG. 2 shows the configuration of the conventional APD optical-receiver system shown in FIG. 1 in detail.
Figure 3A:
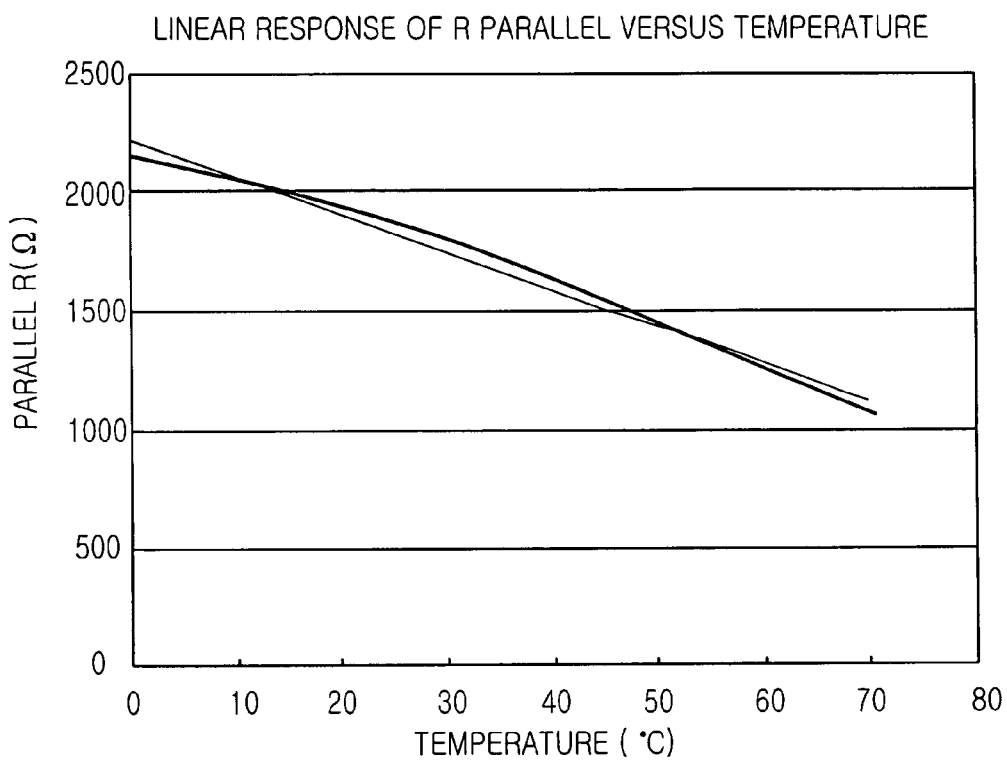
FIGS. 3a and 3b illustrate the aspects of voltage change and amplification in accordance with a conventional temperature-compensating process.
Figure 3B:
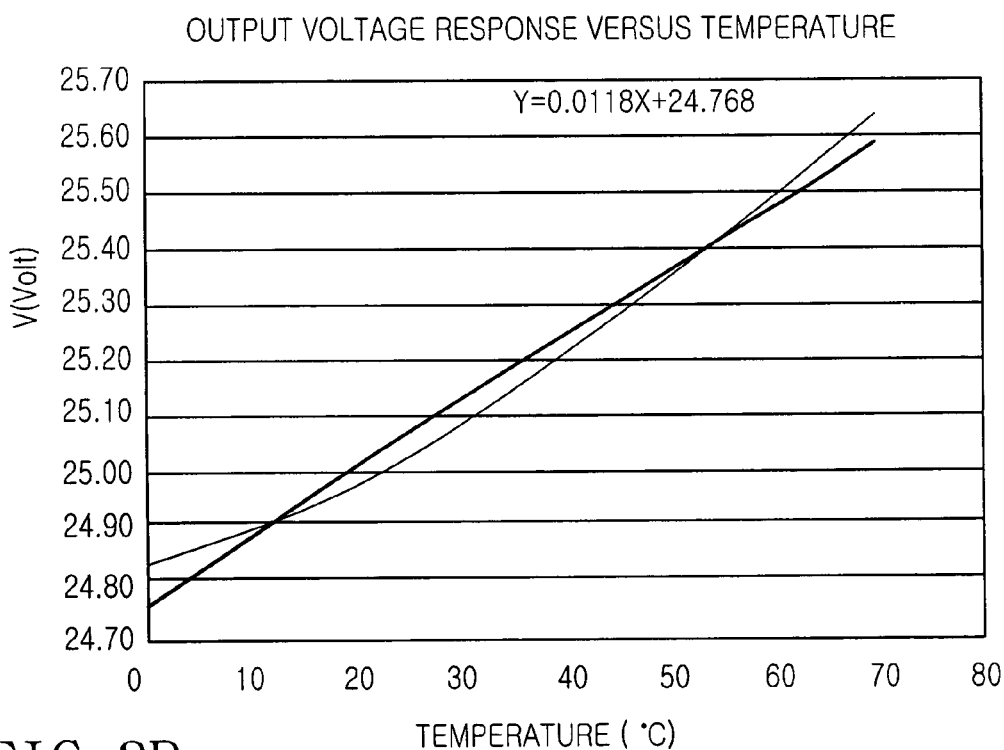
Figure 4:
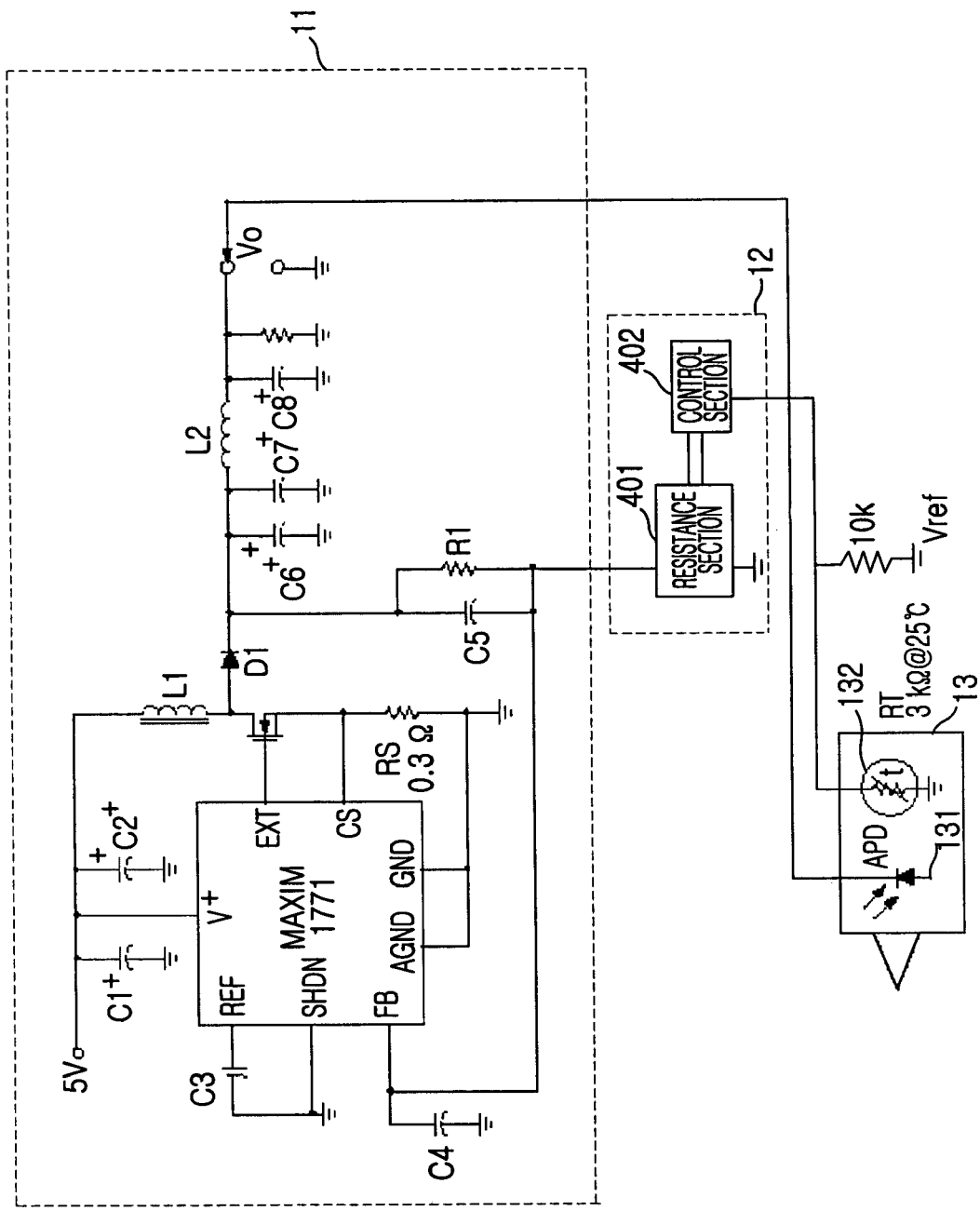
FIG. 4 shows a configuration of an APD optical-receiver system incorporating a temperature-compensating device in accordance with an embodiment of the present invention.

FIG. 4 shows a configuration of an APD optical-receiver system having a temperature-compensating device in accordance with the embodiment of the present invention. As shown, a voltage-generator section 11 may include a "MAXIM 1771" chip, which is manufactured by Maxim Integrated Products Inc., of 120 San Gabriel Dr., Sunnyvale, Calif., USA, and uses a PWM power-switching technique to amplify the voltage with a minimum current; the voltage-generator section 11 generates a reverse bias in the range of 30V to 40V in response to an input voltage of 5V to 8V. Note that an APD 131, irrespective of the Maxim chip incorporated herein, connected to the output Vo of the voltage-generator section 11 suffers a reduction of 0.2%/° C. in the gain factor in accordance with the increase in temperature due to the inherent characteristics of APD. An APD is manufactured using a PN junction of semiconductor. If an voltage is applied by a breakdown voltage, an avalanche effect occurrs so that a high current can be radiated.

Hence, as the temperature increases, the dark current is increased by a thermal excitation effect. Accordingly, a photoelectric rate is reduced. Therefore, it is necessary to increase the reverse bias with the same change rate as the increase in temperature in order to maintain the receiving sensitivity at a constant. To increase the reverse voltage in accordance with temperature in this manner, the input voltage of the voltage generator 11 is controlled via a temperature-compensating section 12, which is connected to the input of the voltage-generator section 11, for controlling the input voltage of the voltage generator 11, thereby compensating the change of the output voltage in accordance with the temperature.

The temperature-compensating section 12 comprises a resistance section 401 and a control section 402. The control section 402 is configured to receive the resistance value of a thermistor 132, recognize the temperature of the APD 131 from the resistance value, determine Vo corresponding to the resistance value, and deliver the determined resistance value for compensating Vo to the resistance section 401, so that the resistance section 401 is indicative of the corresponding resistance value. Note that each APD manufacture supplies datasheet for a reverse bios Vo which is applied to APD according to the gain facter of APD at a room temperature. Since the gain factor variable rate caused by the temperature change is 0.2% as mentioned earlier, if Vo at the room temperature is determinded, Vapp (Reverse bios which is applied to APD according to the change of temperature) in accordance with the change of temperature is changed into 0.2% on the basis of Vo.

The resistance section 401 outputs the resistance value transmitted from the control section 402 from its stepwise digital resistor, thereby controlling the input-voltage level of the voltage-generator section 11, as explained in detail with reference to FIG. 5 hereinafter. Note that the stepwise digital is a digitally controlled register which has 1024 (10 bit) resolution in the rage of 0~10 kΩ (or 20/25 kΩ).

Figure 5:
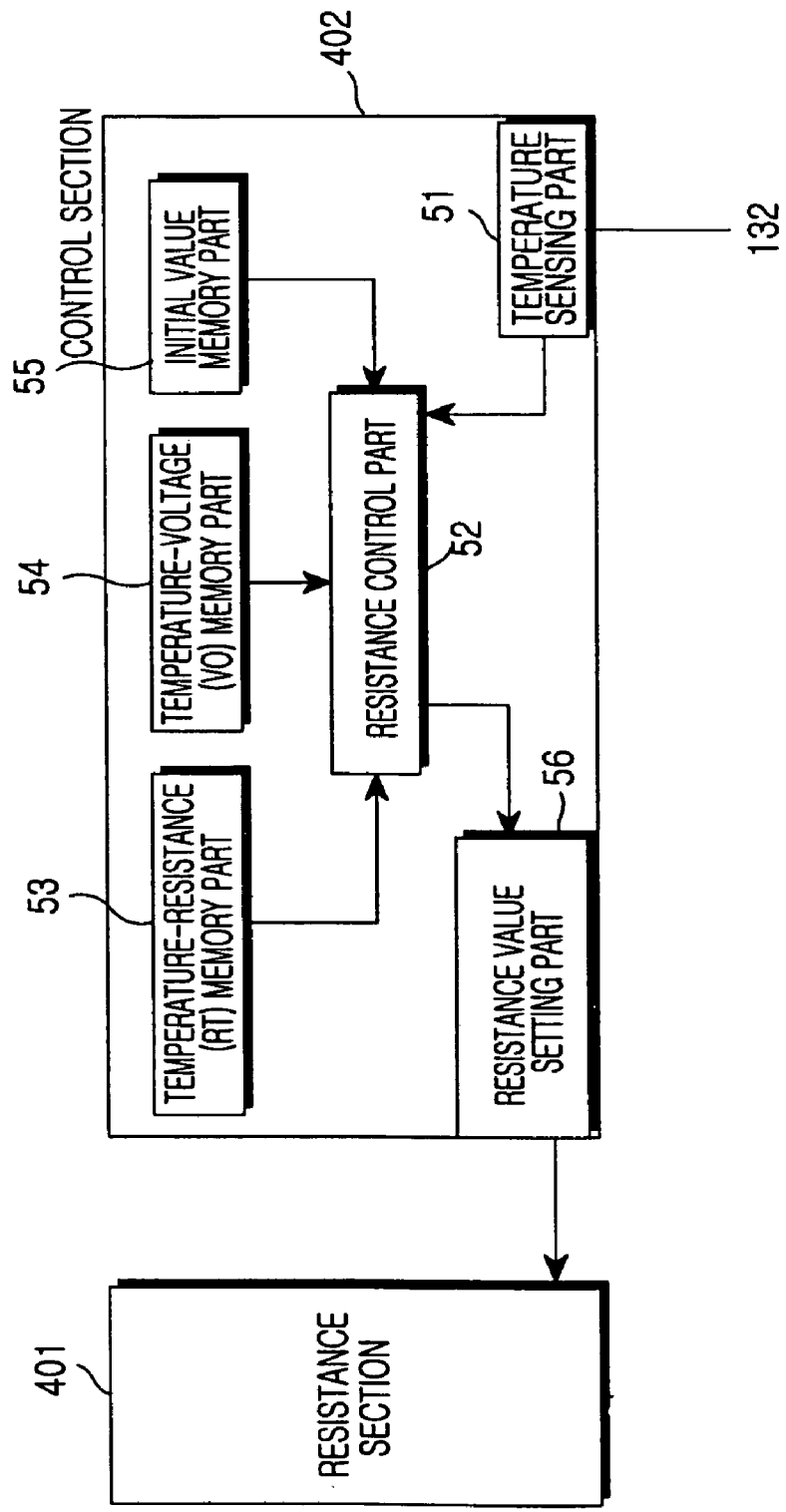
FIG. 5 shows a configuration of a temperature-compensating device in accordance with an embodiment of the present invention.

FIG. 5 shows a configuration of an embodiment of the temperature-compensating device in accordance with the embodiment of the present invention. Briefly, the temperature-compensating device includes a control section 402 for sensing the temperature of the APD 131 and performing a control so that a decrease in the output voltage of the voltage-generator section caused by the temperature change can be compensated; and, a resistance section 401 for outputting a resistance value in accordance with the control output of the control section 402.

The control section 402 includes: a temperature-sensing part 51 connected to a thermistor 132, wherein the temperature-sensing part 51 receives a resistance-value RT from the thermistor 132 and transfers the resistance value to a resistance-control part 52; a temperature-resistance RT memory part 53 for storing the temperature-related data of the APT 131 in accordance with the resistance value of the thermistor 132; a temperature-voltage Vo memory part 54 for storing the output-voltage Vo data in accordance with the temperature of the APD 132; and, an initial value-memory part 55 for storing the initial values including a reference-voltage Vref value and a voltage Vo-resistance R-related data. The resistance-control part 52 arranged to perform a control in such a manner that the resistance-control part 52 transfers the resistance value RT received from the temperature-sensing part 51 to the temperature-resistance RT memory part 53 and receives a corresponding temperature data from the temperature-resistance RT memory part 53, transfers the received temperature data to the temperature-voltage Vo memory part 54 and receives a corresponding output voltage Vo data, and transfers the received output-voltage Vo data to the initial value-memory part 55, so that a resistance-value R data in accordance with the output-voltage Vo is calculated and transferred; and, a resistance value-setting part 56 which receives the resistance-value R from the resistance-control part 52 and transfers the resistance-value R to the resistance section 401 so that the resistance section 401 can set a corresponding resistance.

The resistance value R data in accordance with the output voltage Vo is calculated as follows:

First, note that the voltage generator section of MAX1771 meets the following Equation 1:

$$V_o = V_{ref} \times \left[ \frac{R1}{R2 + R3 + \left( \frac{R4 \times RT}{R4 + RT} \right)} \right] V \quad \text{Equation 1}$$

When the stepwise resister is applied in the above Equation 1, the following Equation 2 is formed.

$$V_o = V_{ref} \times \left[ \frac{R1}{Rp1 + Rp2} \right] V \quad \text{Equation 2}$$

At this time, Rp value is obtained using Vo (provided from the datasheet), Vref, R1, and V (applied voltage) at the room temperature. In case of obtaining two channel digital potentiometers, Rp1 is a fixed value input and Rp2 is changed automatically in accordance with the temperature: Rp=Rp1+Rp2.

In the digital potentiometer, when information is providing for calculating Rp2 value in a micro controller, a value supplied form the datasheet is obtained in Vo again. Also, in case that the temperature is not the room temperature, Vo value is obtained by applying 0.2%° C. and R2 value is also obtained. As a result, the equation for Rp2 value to be input according to the temperature is calculated.

Accordingly, Vo to be supplied to APD is calculated, Rp2 is calculated by inputting Vo of the Equation to the Equation 2, and then Vo is outputted by sending information of Rp2 value to a digital potentiometer. In summary, Vo capable of maintaining a gain factor in a temperature is obtained by calculating Rp2 value, applying the calculated Rp2 to a circuit, and outputting a desired Vo value.

Note that if the resistance section 401, the value of which is determined in accordance with the control section 402, consists of a conventional digital potentiometer, it is possible to construct the resistance section 401 to output a resistance value in the range of 1 kΩ to 10 kΩ because the currently available potentiometers of a high specification have resistance values of 2 channel, 256 steps.

Figure 6A:
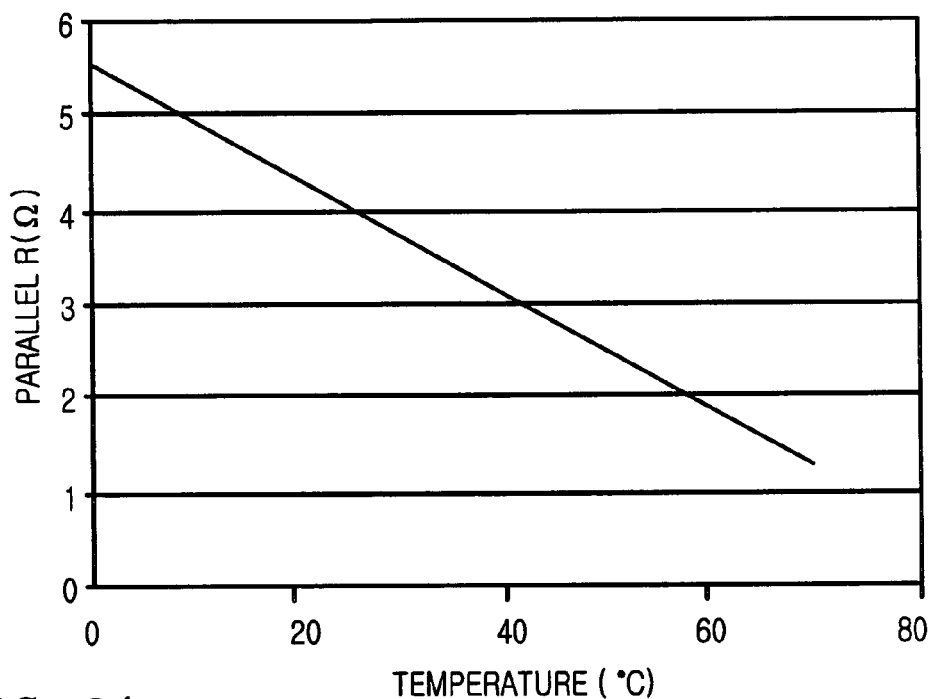
FIGS. 6a and 6b are graphs illustrating the resistance-versus-temperature and the voltage-versus-temperature, respectively, in which a temperature-compensating device in accordance with the present invention is provided; and, FIG. 7 is a operational flow chart of a temperature-compensating device in accordance with an embodiment of the present invention.
Figure 6B:
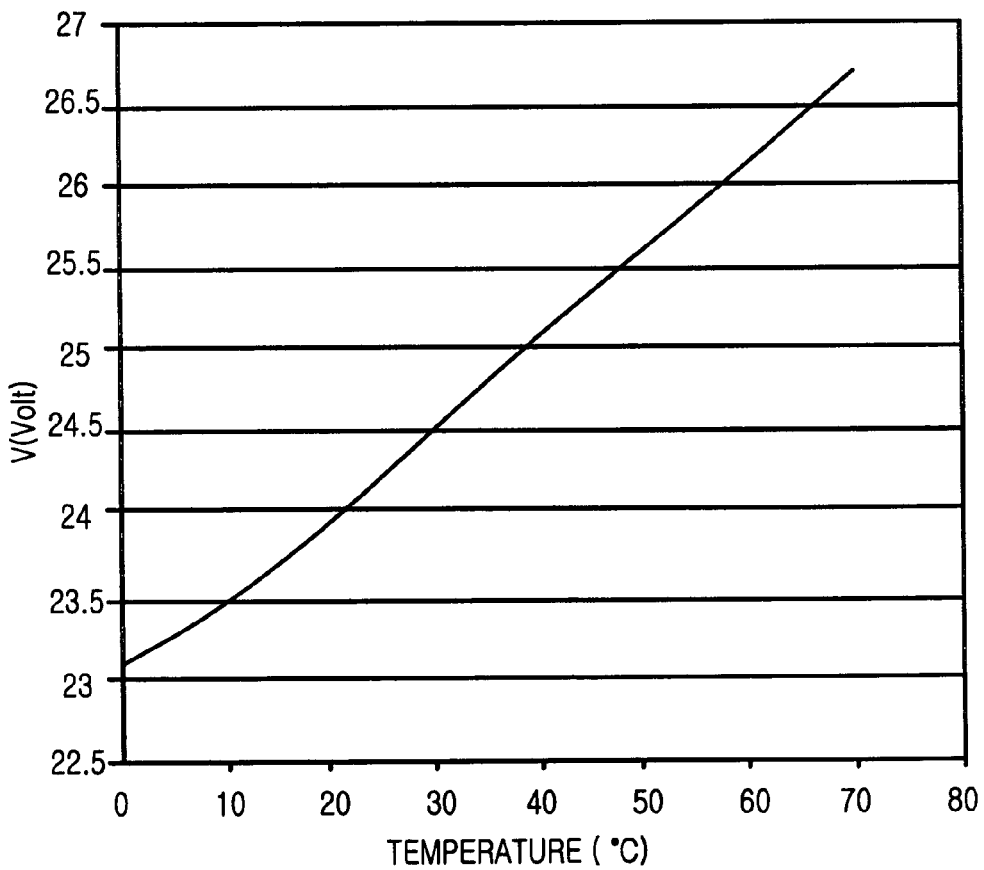

FIGS. 6*a* and 6*b* illustrate the temperature-versus-resistance and the temperature-versus-voltage graphs, respectively, when a temperature-compensating device described above is implemented. In FIG. 6*a*, the X-axis indicates the temperature of the APD 131 and the Y-axis indicates the resistance value of the thermistor 132. In FIG. 6*b*, the X-axis indicates the temperature of the APD 131 and the Y-axis indicates the output voltage of the entire circuit.

Figure 7:
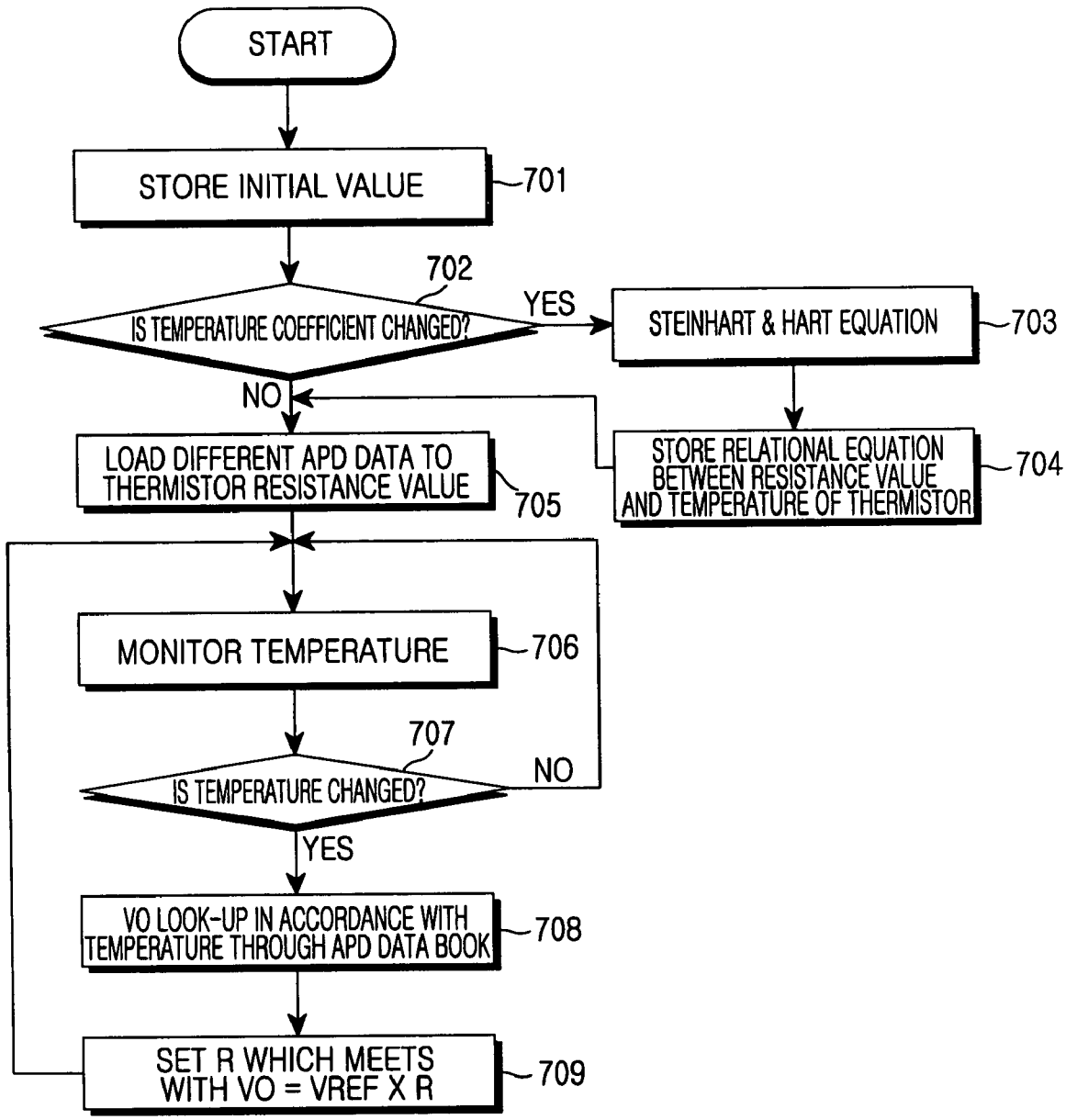

FIG. 7 is a flow chart illustrating the operation steps of the temperature-compensating device in accordance with the teachings of the present invention. First, the inventive temperature-compensating device stores a relational data between the temperature of the APD 131 and the resistance RT of the thermistor, a relational data between the temperature of the APD 131 and the output-voltage Vo, and a relational data between the output-voltage Vo and the resistance R (step 701).

Then, the temperature-compensating device confirms whether it is required to change a temperature coefficient, which forms a relationship? between the thermistor and the temperature of the APD 131 (step 702). If it is required to change the temperature coefficient, the temperature-compensating device prepares a new relational data between the thermistor and the temperature of the APD using the "Steinhart & Hart" equation (step 703). That is, the replacement of the APD 131 is sensed and a new relational data between the resistance and the temperature of the thermistor in the APD is stored.

Briefly, summary of Steinhart-Hart equation for modeling Resistance vs. Temperature characteristics of thermistor is provided herein: (In the listings below A, B, and C are constant factors for the thermistor, R is resistance in ohms, T is temperature in Kelvin)

$$\frac{1}{T} = A + B(\ln(R)) + C(\ln(R))^3$$

Note that that Steinhart & Hart equation defines a resistance according to temperature. In the above equation, T value is obtained by R being varied according to APD temperature as the constant A, B, and C per thermistor are different. Since the above equation is inputted in a Micro controller, the current temperature is monitored by a resistance value, which is transmitted to the Micro controller upon varying the temperature.

Thereafter, the newly prepared data is stored in replacement of the stored data (step 704).

If the temperature coefficient has been changed or if it is not required to change the temperature coefficient, the relational data between the stored temperature of the APD 131 and the resistance RT of the thermistor is loaded (step 705) and the temperature of the APD 131 is monitored continuously. Here, a change in the thermistor resistance RT is monitored.

If the temperature of the APD 131 (i.e., the resistance value RT of the thermistor) is changed (step 707), the output-voltage Vo in accordance with a corresponding temperature is looked up through the relational data between the temperature of the APD and the output-voltage Vo (step 708). Using the output-voltage Vo in accordance with the looked-up temperature, a resistance R is set and outputted which satisfies the following equation: "Vo=Vref×R" (step 709).

As described above, it is possible to provide a digitally controlled temperature-compensating device for an APD receiver system, which has a simple construction and a precise receiving sensitivity as compared to conventional analogue temperature-compensating circuits. In addition, according to the teachings of the present invention, even if individual APDs of different gain factors are used, it is possible to maintain the compensating voltage change caused by the temperature change, thereby overcoming the uncertain limitation of resistance debugging, as a result of which optimum receiving sensitivity can be maintained regardless of the type of APDs that are used.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A temperature-compensating device used in an avalanche photo diode (APD) optical receiver comprising:
   a voltage-generator section;
   an optical-receiving section having an APD and a thermistor for sensing a temperature change in the APD;
   a control means connected to the thermistor to perform a control in such a manner that the control means receives a first resistance value from the thermistor, determines the temperature data of the APD using the first resistance value, determines an output-voltage data corresponding to the first resistance value, and determines a second resistance-value data for generating an output voltage in accordance with the output-voltage data; and,
   a resistance means configured with a digital potentiometer having a resistance value of a plurality of steps.

2. The temperature-compensating device according to claim 1, wherein the control means comprises:
   a resistance-control means;
   a temperature-sensing means connected to the thermistor for receiving the first resistance value from the thermistor and transferring the same to the resistance-control means;
   a temperature-resistance memory means for storing the temperature data of the APD in accordance with the first resistance value;
   a temperature-voltage memory means for storing the output-voltage data in accordance with the temperature of the APD;
   an initial value-memory means for storing initial values including a relational data between a reference-voltage value, the output voltage, and the second resistance value;
   the resistance-control means is configured to: transfer the first resistance value received from the temperature-sensing means to the temperature-resistance memory means and receive temperature data in accordance with the first resistance value, transfer the received temperature data to the temperature-voltage memory means and receive output-voltage data in accordance with the temperature, and transfer the received output-voltage data to the initial value memory means and obtain and transfer the second resistance-value data in accordance with the output voltage; and,
   a resistance value-setting means for receiving the second resistance-value data from the resistance-control means and transferring the second resistance-value data to the resistance means.

3. The temperature-compensating device according to claim 1, wherein the resistance means is configured to output a resistance in the range of 1 kΩ to 10 kΩ.

4. The temperature-compensating device according to claim 1, wherein the temperature-compensating device is configured to perform the following steps:
   i) storing initial values including the reference-voltage value of the APD, the temperature data of the APD in accordance with the first resistance value, the output voltage-related data in accordance with the temperature of the APD, and the output voltage of the second resistance-value related data;
   ii) confirming whether a temperature coefficient of the temperature-compensating device is changed and storing a new relational data in accordance with the "Steinhart & Hart" equation when the temperature coefficient has been changed;
   iii) receiving the first resistance value from the thermistor and monitoring the change in the temperature of the APD;
   iv) determining the second resistance-value data through the temperature data in accordance with the first resistance value, the output voltage-related data in accordance with the temperature of the APD, and the output voltage of the second resistance value-related data if the change in the temperature of the APD is sensed as the result of monitoring in the above step; and,
   v) transferring the second resistance-value data to the resistance means so that the resistance means has the second resistance value.

5. A temperature-compensating device used in an avalanche photo diode (APD) optical receiver comprising:
   a voltage-generator section;
   an optical-receiving section having an APD and a thermistor for sensing a temperature change in the APD;

a control means containing a temperature-voltage memory means for storing the output-voltage data in accordance with the temperature of the APD and being coupled to the thermistor to perform a control in such a manner that the control means receives a first resistance value from the thermistor, determines the temperature data of the APD using the first resistance value, determines an output-voltage data corresponding to the first resistance value, and determines a second resistance-value data for generating an output voltage in accordance with the output-voltage data; and, a resistance means configured with a digital potentiometer having a resistance value of a plurality of steps.

6. The temperature-compensating device according to claim 5, wherein the control means further comprises:

a resistance-control means;

a temperature-sensing means connected to the thermistor for receiving the first resistance value from the thermistor and transferring the same to the resistance-control means;

a temperature-voltage memory means for storing the output-voltage data in accordance with the temperature of the APD;

an initial value-memory means for storing initial values including a relational data between a reference-voltage value, the output voltage, and the second resistance value;

the resistance-control means is configured to: transfer the first resistance value received from the temperature-sensing means to the temperature-resistance memory means and receive temperature data in accordance with the first resistance value, transfer the received temperature data to the temperature-voltage memory means and receive output-voltage data in accordance with the temperature, and transfer the received output-voltage data to the initial value memory means and obtain and transfer the second resistance-value data in accordance with the output voltage; and, a resistance value-setting means for receiving the second resistance-value data from the resistance control means and transferring the second resistance-value data to the resistance means.

7. The temperature-compensating device according to claim 5, wherein the resistance means is configured to output a resistance in the range of 1 k$\Omega$ to 10 k$\Omega$.

8. The temperature-compensating device according to claim 5, wherein the temperature-compensating device is configured to perform the following steps:

i) storing initial values including the reference-voltage value of the APD, the temperature data of the APD in accordance with the first resistance value, the output voltage-related data in accordance with the temperature of the APD, and the output voltage of the second resistance-value related data;

ii) confirming whether a temperature coefficient of the temperature-compensating device is changed and storing a new relational data in accordance with the "Steinhart & Hart" equation when the temperature coefficient has been changed;

iii) receiving the first resistance value from the thermistor and monitoring the change in the temperature of the APD;

iv) determining the second resistance-value data through the temperature data in accordance with the first resistance value, the output voltage-related data in accordance with the temperature of the APD, and the output voltage of the second resistance value-related data if the change in the temperature of the APD is sensed as the result of monitoring in the above step; and, v) transferring the second resistance-value data to the resistance means so that the resistance means has the second resistance value.

\* \* \* \* \*